United States Patent
Anderson et al.

(10) Patent No.: US 6,833,322 B2
(45) Date of Patent: Dec. 21, 2004

(54) APPARATUSES AND METHODS FOR DEPOSITING AN OXIDE FILM

(75) Inventors: Roger N. Anderson, Sunnyvale, CA (US); Paul B. Comita, Menlo Park, CA (US); Ann Waldhauer, La Honda, CA (US); Norma B. Riley, Dublin, CA (US)

(73) Assignee: Applied Materials, Inc., Santa Clara, CA (US)

( * ) Notice: Subject to any disclaimer, the term of this patent is extended or adjusted under 35 U.S.C. 154(b) by 14 days.

(21) Appl. No.: 10/273,830

(22) Filed: Oct. 17, 2002

(65) Prior Publication Data

US 2004/0077184 A1 Apr. 22, 2004

(51) Int. Cl.[7] ............................................... H01L 21/44
(52) U.S. Cl. ....................... 438/680; 438/681; 438/756; 438/757; 438/758; 438/769; 438/787; 427/255.28; 361/322
(58) Field of Search ................................. 438/680–681, 438/756–758, 769, 787; 427/255.28, 58, 585; 361/322

(56) References Cited

U.S. PATENT DOCUMENTS

| | | | |
|---|---|---|---|
| 4,980,307 A | * 12/1990 | Ito et al. ...................... | 438/591 |
| 5,042,887 A | 8/1991 | Yamada | |
| 5,082,359 A | 1/1992 | Kirkpatrick | |
| 5,459,326 A | 10/1995 | Yamada | |
| 5,814,194 A | 9/1998 | Deguchi et al. | |
| 5,830,801 A | * 11/1998 | Shiralagi et al. ............ | 438/586 |
| 5,855,967 A | 1/1999 | Kirkpatrick | |
| 6,149,987 A | * 11/2000 | Perng et al. ................. | 427/579 |
| 6,207,282 B1 | 3/2001 | Deguchi et al. | |
| 6,251,835 B1 | 6/2001 | Chu et al. | |
| 6,331,227 B1 | 12/2001 | Dykstra et al. | |
| 6,372,291 B1 | * 4/2002 | Hua et al. ............... | 427/255.28 |
| 6,375,790 B1 | 4/2002 | Fenner | |
| 6,395,092 B1 | * 5/2002 | Sugiarto et al. ............ | 118/695 |
| 6,523,494 B1 | * 2/2003 | Perng et al. ............. | 118/723 E |
| 6,610,354 B2 | * 8/2003 | Law et al. ..................... | 427/68 |
| 2001/0033128 A1 | 10/2001 | Torti et al. | |
| 2001/0054686 A1 | 12/2001 | Torti et al. | |
| 2002/0006877 A1 | 1/2002 | Chu et al. | |
| 2002/0014407 A1 | 2/2002 | Allen et al. | |
| 2002/0016079 A1 | 2/2002 | Dykstra et al. | |
| 2002/0036261 A1 | 3/2002 | Dykstra | |
| 2002/0052124 A1 | * 5/2002 | Raaijmakers et al. ........ | 438/778 |
| 2003/0019427 A1 | * 1/2003 | Ghanayem et al. ......... | 118/712 |
| 2003/0073293 A1 | * 4/2003 | Ferro et al. ................. | 438/478 |
| 2003/0082300 A1 | * 5/2003 | Todd et al. ............ | 427/255.27 |
| 2003/0124873 A1 | * 7/2003 | Xing et al. ................. | 438/770 |
| 2003/0207580 A1 | * 11/2003 | Li et al. ..................... | 438/700 |

FOREIGN PATENT DOCUMENTS

| | | | | |
|---|---|---|---|---|
| EP | 1-067585 a2 | * | 7/2000 | ........... H01L/21/00 |
| WO | WO 00/26431 | | 5/2000 | |

(List continued on next page.)

OTHER PUBLICATIONS

Miki et al. "Electron and hole traps in SiO2 films thermally grown on si substrates in ultra–dry oxygen" Ieee trans on electron devices vol. 35 No. 12 Dec. 1998 p. 2245–2251.*

*Primary Examiner*—Matthew Smith
*Assistant Examiner*—Granvill D. Lee, Jr.
(74) *Attorney, Agent, or Firm*—Blakely Sokoloff Taylor & Zafman

(57) ABSTRACT

Methods and apparatuses for forming an oxide film. The method includes depositing an oxide film on a substrate using a process gas mixture that comprises a silicon source gas, an oxygen gas, and a hydrogen gas, and a process temperature between 800° C. and 1300° C. During the deposition of the oxide film, the process gas mixture comprises less than 6% oxygen, silicon gas, and predominantly hydrogen.

54 Claims, 9 Drawing Sheets

FOREIGN PATENT DOCUMENTS

| | | |
|---|---|---|
| WO | WO 01/06538 A1 | 1/2001 |
| WO | WO 01/36704 A2 | 5/2001 |
| WO | WO 01/40532 A2 | 6/2001 |
| WO | WO 01/41181 A1 | 6/2001 |
| WO | WO 01/43160 A1 | 6/2001 |
| WO | WO 01/45141 A2 | 6/2001 |
| WO | WO 01/48794 A2 | 7/2001 |
| WO | WO 01/59172 A1 | 8/2001 |
| WO | WO 01/70378 A1 | 9/2001 |
| WO | WO 01/83238 A1 | 11/2001 |
| WO | WO 01/84612 A1 | 11/2001 |
| WO | WO 02/05315 A2 | 1/2002 |
| WO | WO 02/06556 A1 | 1/2002 |
| WO | WO 02/06557 A1 | 1/2002 |

* cited by examiner

APPARATUSES AND METHODS FOR DEPOSITING AN OXIDE FILM

BACKGROUND OF THE INVENTION

1. Field of the Invention

The present invention relates to the field of semiconductor processing and more specifically to methods and apparatuses for depositing an oxide film.

2. Discussion of Related Art

Silicon oxide ($SiO_2$) films and their binary and ternary silicates (generally referred to as oxide films) have wide use in fabrication of integrated circuits such as microprocessors and memories. The oxide films are used as insulations between polysilicon layers, metal layers, and metal layers in multilevel metal systems. The oxide films can also be used as diffusion sources, diffusion masks, implantation masks, spacers, and final passivation layers. Currently, there are three different methods of forming an oxide film, dry oxidation (also known as thermal oxidation), steam oxidation, and oxide deposition.

In dry oxidation, an oxide film is grown on a silicon substrate. In one embodiment, the oxide film is grown in a conventional furnace system. FIG. 1 illustrates a furnace system 100 which is a hot wall furnace system including a three-zone resistance furnace 112, a quartz reactor tube 102, a gas inlet 104, a pressure sensor 106, and a wafer boat 108. Multiple silicon wafers 110 are vertically positioned upon the wafer boat 108. The substrates are radiantly heated to a temperature between 1100° C. and 1300° C. by resistive heating coils surrounding the tube 102. Oxygen ($O_2$) gas is metered into one end of the tube 102 (gas inlet 104) using a mass flow controller. The $O_2$ gas decomposes releasing oxygen (O) atoms; and, the oxygen atoms react with the silicon atoms at the surface of the silicon substrate 110 to form the oxide film. Hours or even days are often needed to form a sufficiently thick oxide film under dry oxidation because after the formation of the first few atomic layers, longer diffusion is required for the oxygen to get to the silicon surface to grow the oxide film. The long hours required to grow the oxide film unnecessarily decreases the throughput for making the oxide film as well as the throughput for making other devices that need the oxide film.

In steam oxidation, an oxide film is also grown on a silicon substrate. The furnace system 100 described in FIG. 1 can also be used. Instead of using an $O_2$ gas, a water vapor ($H_2O$) is introduced into the furnace system 100. With the water vapor, the oxide film can be formed at a lower temperature than in the case of the dry oxidation. A sufficiently thick oxide film can be formed in a shorter amount of time than as required for the case of the dry oxidation. One reason for that is that it is easier to break the oxygen bond in the water vapor than to break the oxygen bond in the $O_2$ gas. However, the oxide film formed under the steam oxidation is less pure than the oxide film formed under the dry oxidation because it is more difficult to get pure water than to get pure $O_2$ gas.

In oxide deposition, an oxide film is deposited onto the surface of a silicon substrate. The furnace system 100 described in FIG. 1 can also be used. A silicon source gas such as silane ($SiH_4$) and an oxidation source gas such as nitrous oxide ($NO_2$) are metered into the end of the tube 102 (gas inlet 104) using mass flow controllers. A temperature between 300° C. and 400° C. can be used for the oxide deposition. The $SiH_4$ gas and the $NO_2$ gas are decomposed under this temperature. The silicon and the oxygen intermediate species react near the surface of the silicon substrate and attach to the substrate surface to form the oxide film. Depositing the oxide film requires less time than growing the oxide film as in the case of the dry oxidation. However, the deposited oxide film has a much lower film density and quality than the grown oxide film. Additionally, the oxide film tends to contain more impurities because any impurity at the surface of the silicon wafer is trapped at the substrate surface when the oxide film is deposited. Therefore, the oxide film formed by oxide deposition typically has a weaker film interface with the substrate than the oxide film formed by growing.

High quality oxide films are important for continuous advancement in the fabrication of semiconductor devices. High quality oxide films are needed for film stacks such as silicon on insulator (SOI) substrates that are currently in high demand. As illustrated in FIG. 2, a typical SOI substrate 200 includes a silicon substrate 202, an oxide layer 204, and a silicon layer 206. Devices such as transistors and capacitors typically formed on a silicon substrate can be formed on an SOI substrate. SOI substrates are in high demand because they have low current leakage, which allows electronic devices created on the SOI substrates to consume less power. Additionally, the electronic devices created on the SOI substrates can be made smaller.

There are several methods known in the art that can be used to create an SOI substrate. For example, an SOI substrate may be fabricated using a separation by implant oxygen (SIMOX) process, of a bond and etch back (BE) process, a hydrogen implant and release silicon process (sometimes known as SmartCut®) ("SmartCut®" is a registered trademark of Soitec Silicon on insulator technology S.A.), or by using a plasma implanting oxygen into silicon process.

In any of the SOI forming methods, forming a high quality oxide film with a high throughput is crucial for a making a good SOI substrate.

SUMMARY OF THE INVENTION

The embodiments of the present invention relates methods and apparatuses for forming a high quality oxide film that can be used for fabricating a film stack such as a silicon on insulator (SOI) substrate. The oxide film is deposited on a substrate under a high temperature condition wherein the temperature is between 800° C. and 1300° C., and ideally, between 1000° C. and 1200° C. To deposit the oxide film, a process gas mixture comprising hydrogen ($H_2$) gas, oxygen ($O_2$) gas, a silicon source gas (e.g., silane, disilane, dichlorosilane, trichlorosilane, tetrachlorosilane, and hexachlorodisilane) is used. A chlorine containing source gas such as HCl or $Cl_2$ may also be used. At all time during the film deposition, the process gas mixture comprises less than 6% oxygen gas, a silicon source gas, and predominantly hydrogen gas. The process gas mixture is thermally decomposed and the oxide film is then deposited on the substrate. The oxide film deposited under such condition is formed in a short period of time, for example, in a matter of minutes. The oxide film further has a high density that is comparable to an oxide film that is formed by the dry oxidation. The oxide film also has substantially no impurity and no impurity trapped on the substrate. The oxide film deposited according to the exemplary embodiment is deposited with a high throughput and thus, allows for efficient fabrication of semiconductor devices that includes the oxide film.

BRIEF DESCRIPTION OF THE DRAWINGS

The present invention is illustrated by way of example and not limitation in the figures of the accompanying drawings, in which like references indicate similar elements and in which.

DETAILED DESCRIPTION OF THE PRESENT INVENTION

Figure 1:
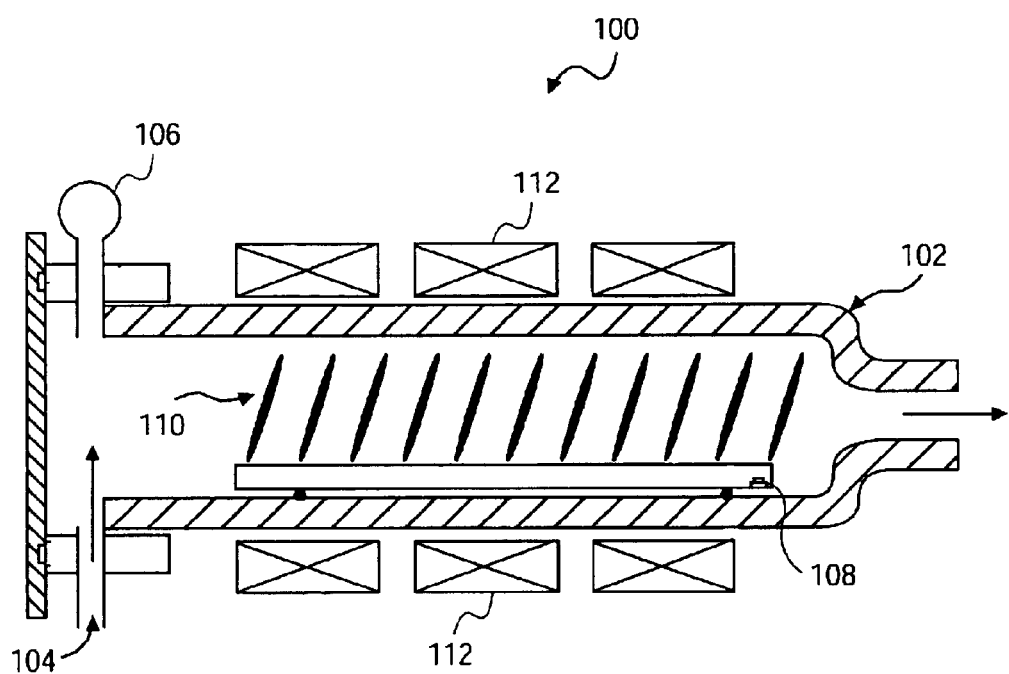
FIG. 1 illustrates an exemplary furnace system of the prior art that is used to form an oxide film.
Figure 2:
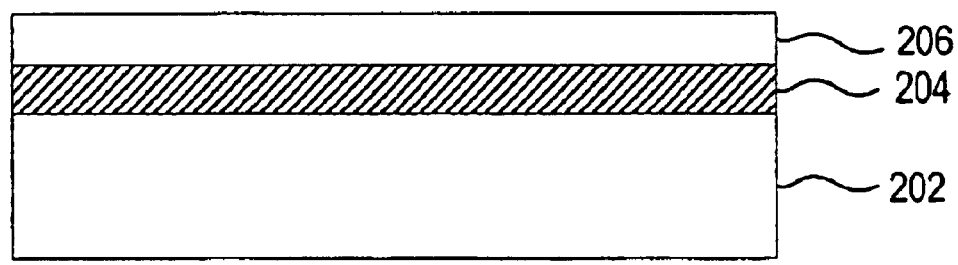
FIG. 2 illustrates a typical SOI substrate.

The embodiment of the present invention describes methods and apparatuses for forming an oxide film that can be used for fabricating a film stack such as a silicon on insulator (SOI) substrate. In the following description numerous specific details are set forth in order to provide a through understanding of the present invention. One skilled in the art will appreciate that these specific details are not necessary in order to practice the present invention. In other instances, well known equipment features and processes have not been set forth in detail in order to not unnecessarily obscure the present invention.

In one exemplary embodiment, a first substrate is provided. An oxide film is then deposited on the substrate using a process gas mixture that comprises a silicon source gas, an oxygen gas, and a hydrogen gas, and a process temperature between 800° C. and 1300° C. During the deposition of the oxide film, the process gas mixture comprises less than 6% oxygen, a silicon gas, and predominantly hydrogen. The process gas mixture may comprise a sufficient amount of the silicon gas to allow for deposition of the oxide film. In one embodiment, the process gas mixture may comprise about 1–10% silicon gas. In another embodiment, the process gas mixture may comprise less than 6% silicon gas.

In another exemplary embodiment, an oxide film is deposited on a silicon substrate using a chemical vapor deposition chamber. The oxide film is deposited under a high temperature condition wherein the temperature is between 800° C. and 1300° C. In one embodiment, the temperature is between 1000° C. and 1200° C. To deposit the oxide film, a process gas mixture comprising hydrogen ($H_2$) gas, oxygen ($O_2$) gas, a silicon source gas (e.g., silane, disilane, dichlorosilane, trichlorosilane, tetrachlorosilane, and hexachlorodisilane) is introduced into the chamber. Optionally, water, $H_2O$, can be used instead of $H_2$ and $O_2$. The process gas mixture is introduced such that at all time during the deposition, the chamber contains less than 6% oxygen gas, a silicon source gas, and predominantly hydrogen gas. The process gas mixture may comprise a sufficient amount of the silicon gas to allow for deposition of the oxide film. In one embodiment, the process gas mixture may comprise about 1–10% silicon gas. In another embodiment, the process gas mixture may comprise less than 6% silicon gas. The process gas mixture is thermally decomposed and the silicon atoms and oxygen atoms react together to form/deposit the oxide film on the substrate. The oxide film deposited under such condition is formed in a short period of time, for example, in a matter of minutes. The oxide film further has a high density that is comparable to an oxide film that is formed by the dry oxidation. The oxide film also has substantially no impurities. The oxide film further has a good interface with the substrate because no impurity is trapped at the surface of the substrate. The oxide film deposited according to the exemplary embodiment is deposited with a high throughput and thus, allows for efficient fabrication of semiconductor devices that includes the oxide film.

In another exemplary embodiment, the method of forming the oxide film described above is incorporated into a method of making a film stack such as silicon on insulator (SOI) substrate. Optionally, the film stack is protected with an encapsulation layer that is formed in a controlled environment, for example, a loadlock apparatus. To form the encapsulation layer on the film stack, an ozone ($O_3$) gas is introduced into the loadlock apparatus. The film stack is "soaked" with the ozone gas. The ozone gas forms a stable and clean oxide layer on the film stack. The film stack formed using this embodiment comprises an oxide film that has a high density, high purity, high quality, and an encapsulation layer that protects the film stack from contaminants.

Figure 3:
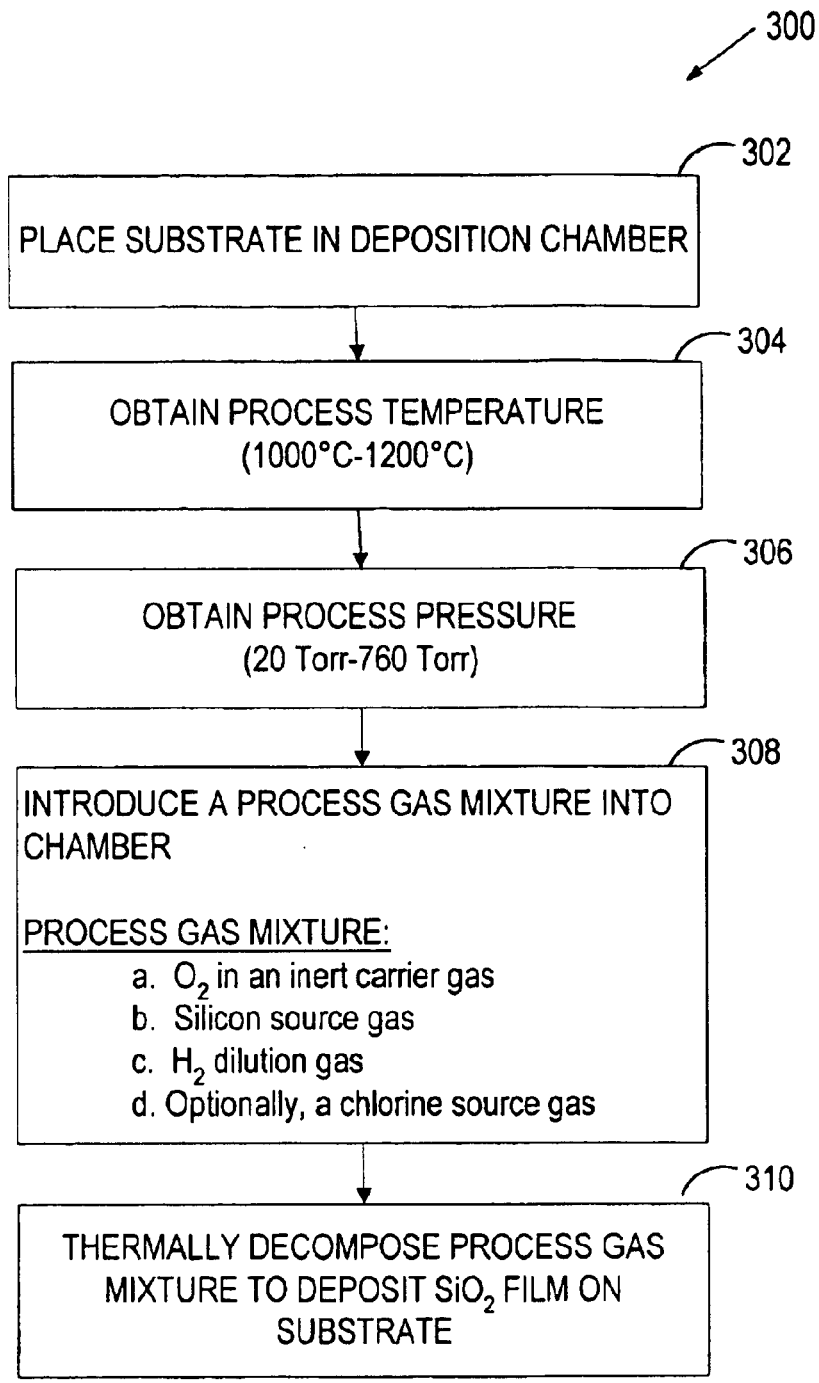
FIG. 3 illustrates an exemplary method of forming an oxide film in accordance to the present invention.

FIG. 3 illustrates an exemplary method 300 of forming an oxide film in accordance with the present invention. At operation 302, a substrate is placed in a deposition chamber. In one embodiment, the deposition chamber is a single wafer deposition chamber (described below). At operation 304, a process temperature between 800° C. and 1300° C., ideally, between 1000° C. and 1200° C., is obtained. At operation 306, a process pressure between 20 Torr and 760 Torr is obtained.

At operation 308, a process gas mixture is introduced into the deposition chamber. The process gas mixture comprises (a) an oxygen gas carried in an inert carrier gas such as helium, argon, and xenon; (b) a silicon source gas such as silane ($SiH_4$), disilane ($Si_2H_6$), dichlorosilane ($SiH_2Cl_2$), trichlorosilane ($SiHCl_3$), tetrachlorosilane ($SiCl_4$), and hexachlorodisilane ($Si_2Cl_6$); and (c) a dilution gas such as hydrogen gas. In one embodiment, where the silicon source gas does not include any chlorine, a hydrochloride source gas (HCl) is included in the process gas mixture. The chlorine is necessary in that at high temperature, the chlorine cleans the surface of the substrate by etching away a few layers of the substrate prior to the deposition of the oxide film. The chlorine further ensures that contaminants deposited on the substrate are substantially removed. The oxide film formed thus has a good interface with the substrate surface. At all time during the deposition, the process gas mixtures that are introduced into the deposition chamber comprises less than 6% oxygen, a silicon gas, a chlorine containing gas, and predominantly hydrogen. The process gas mixture may comprise a sufficient amount of the silicon gas to allow for deposition of the oxide film. In one embodiment, the process gas mixture may comprise about 1–10% silicon gas. In another embodiment, the process gas mixture may comprise less than 6% silicon gas. In one embodiment, the oxygen gas is diluted with helium and has a concentration of less than 25% prior to being combined with the silicon source gas and the hydrogen source gas to from the process gas mixture.

At operation 310, the process gas mixture is thermally decomposed. The silicon atoms and the oxygen atoms react together and a silicon oxide (SiO$_2$) film (or oxide film) is deposited on the substrate. The method 300 can be integrated into forming a film stack such as an SOI substrate, wherein various films are deposited onto the substrate. (See below).

The method 300 above enables a fast deposition of a high quality oxide film. The presence of oxygen facilitates the deposition of the oxide film. And, the high process temperature enables a quick deposition of the oxide film. In one embodiment, to prevent an explosion that could be caused by a reaction of the oxygen gas and the hydrogen gas in the deposition chamber at a temperature as high as between 800° C. and 1300° C., it is required that the amount of the oxygen that is introduced into the deposition chamber should not exceed 6% and that about 94% of the process gas mixture is hydrogen. Additionally, the oxygen gas can be safely handled by being supplied with an inert carrier gas such as helium. In one embodiment, the oxygen gas is diluted to 25% with the helium gas. The 25% oxygen in helium gas is introduced into the deposition chamber.

Figure 4:
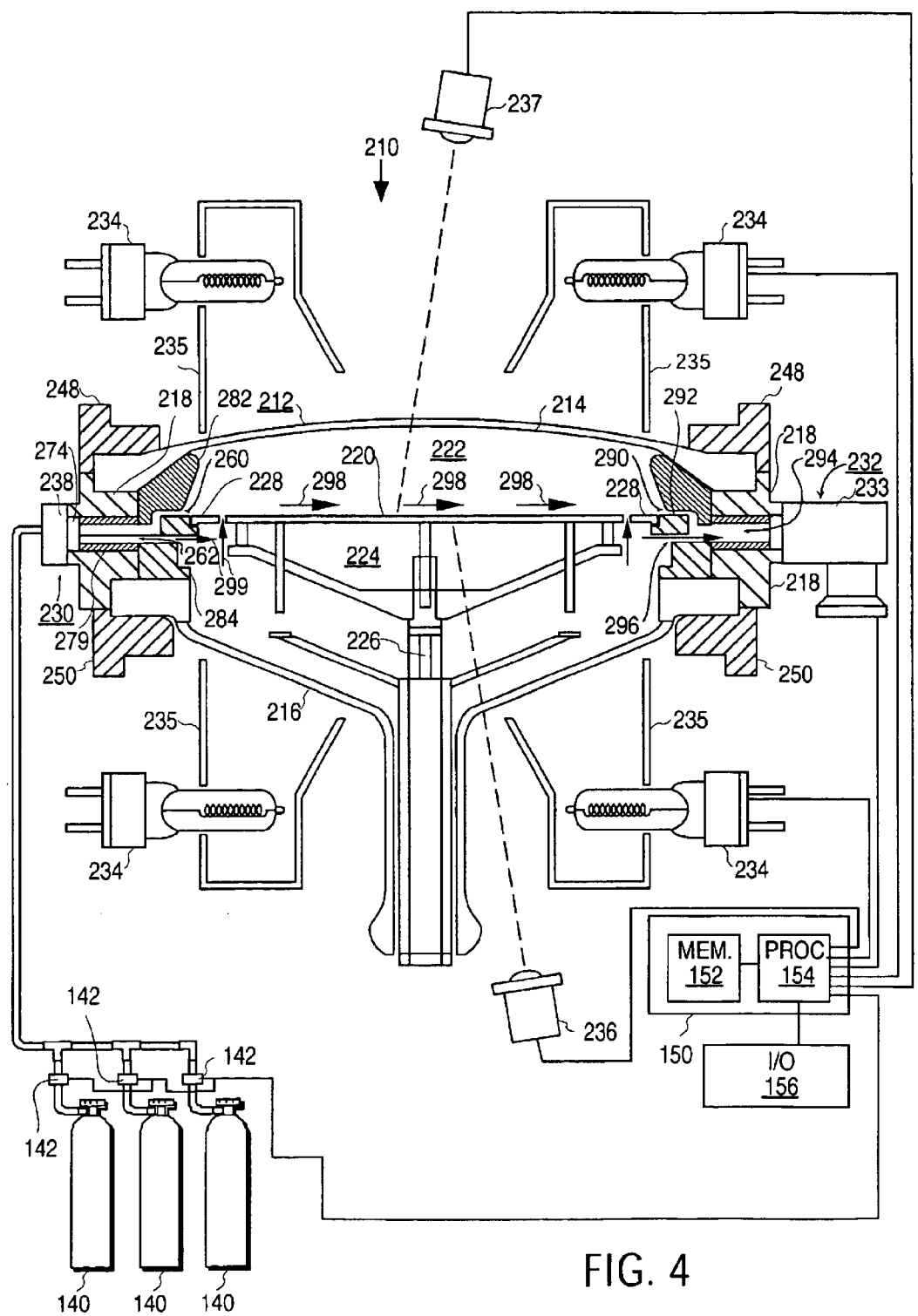
FIG. 4 illustrates an exemplary apparatus which can be utilized to form an oxide film in accordance with the present invention.

FIG. 4 illustrates an exemplary apparatus 210 which can be used to deposit the oxide film in accordance to the method 300 described in FIG. 3. The apparatus 210 is a single wafer deposition chamber. The apparatus 210 comprises a deposition chamber 212 having an upper dome 214, a lower dome 216, and a sidewall 218 between the upper and lower domes 214 and 216. Cooling fluid (not shown) is circulated through sidewall 218 in order to cool the sidewall 218. An upper liner 282 and a lower liner 284 are mounted against the inside surface of the sidewall 218. The upper and lower domes 214 and 216 are made of a transparent material to allow heating light to pass through into the chamber 212.

Within the chamber 212 is a flat, circular susceptor 220 for supporting a substrate (e.g., a wafer) in a horizontal position. The susceptor 220 extends transversely across the chamber 212 at the sidewall 218 to divide the chamber 212 into an upper portion 222 above the susceptor 220 and a lower portion 224 below the susceptor 220. The susceptor 220 is mounted on a shaft 226 which extends perpendicularly downwardly from the center of the bottom of the susceptor 220. The shaft 226 is connected to a motor (not shown) which rotates the shaft 226 in order to rotate the susceptor 220. The substrate supported by the susceptor 220 is rotated throughout the smoothing process. An annular preheat ring 228 is connected at its outer periphery to the inside periphery of the lower liner 284 and extends around the susceptor 220. The pre-heat ring 228 is in the same plane as the susceptor 228 with the inner edge of the pre-heat ring 228.

An inlet manifold 230 is positioned in the side of the chamber 212 and is adapted to admit process gases from source of gases, such as tanks 140, into the chamber 212. An outlet port 232 is positioned in the side of chamber 212 diagonally opposite the inlet manifold 230 and is adapted to exhaust gases from the deposition chamber 212.

A plurality of high intensity lamps 234 are mounted around the chamber 212 and direct their light through the upper and lower domes 214 and 216 onto the susceptor 220 (and the preheat ring 228) to heat the susceptor 220 (and the preheat ring 228). The susceptor 220 and the preheat ring 228 are made of a material, such as silicon carbide, coated graphite which is opaque to the radiation emitted from the lamps 234 so that they can be heated by radiation from the lamps 234. The upper and lower domes 214 and 216 are made of a material which is transparent to the light of the lamps 234, such as clear quartz. The upper and lower domes 214 and 216 are generally made of quartz because quartz is transparent to light of both visible and IR frequencies. Quartz exhibits a relatively high structural strength; and it is chemically stable in the process environment of the deposition chamber 212. Although lamps are the preferred elements for heating wafers in deposition chamber 220, other methods may be used such as resistance heaters and Radio Frequency inductive heaters.

An infrared temperature sensor 236 such as a pyrometer is mounted below the lower dome 216 and faces the bottom surface of the susceptor 220 through the lower dome 216. The temperature sensor 236, is used to monitor the temperature of the susceptor 220 by receiving infra-red radiation emitted from the susceptor 220 when the susceptor 220 is heated. A temperature sensor 237 for measuring the temperature of a wafer may also be included if desired.

An upper clamping ring 248 extends around the periphery of the outer surface of the upper domes 214. A lower clamping ring 250 extends around the periphery of the outer surface of the lower dome 216. The upper and lower clamping rings are secured together so as to clamp the upper and lower domes 214 and 216 to the side wall 218.

The gas inlet manifold 230 included in the apparatus 210 feed process gases into the chamber 212. The gas inlet manifold 230 includes a connector cap 238, a baffle 274, and an insert plate 279 positioned within the sidewall 218. Additionally, the connector cap 238, the baffle 274, and the insert plate 279 are positioned within a passage 260 formed between upper liner 282 and lower liner 284. The passage 260 is connected to the upper portion 222 of chamber 212. The process gases are introduced into the chamber 212 from the gas cap 238; the gases are then flown through the baffle 274, through the insert plate 279, and through the passage 260 and then, into the upper portion 222 of chamber 212.

The apparatus 210 also includes an independent inert gas inlet 262 for feeding an inert purge gas, such as but not limited to, hydrogen (H$_2$) and Nitrogen (N$_2$), into the lower portion 224 of deposition chamber 212. As shown in FIG. 4, the inert purge gas inlet 262 can be integrated into gas inlet manifold 230, if desired, as long as a physically separate and distinct passage 262 through the baffel 274, the insert plate 279, and the lower liner 284 is provided for the inert purge gas, so that the inert purge gas can be controlled and directed independent of the process gas. The inert purge gas inlet 262 needs not be integrated or positioned along with deposition gas inlet manifold 230, and can, for example, be positioned on the apparatus 210 at an angle of 90° from a deposition gas inlet manifold 230.

As mentioned, the apparatus 210 also includes a gas outlet 232. The gas outlet 232 includes an exhaust passage 290 which extends from the upper chamber portion 222 to the outside diameter of sidewall 218. The exhaust passage 290 includes an upper passage 292 formed between the upper liner 282 and the lower liner 284 and which extends between the upper chamber portion 222 and the inner diameter of sidewall 218. Additionally, the exhaust passage 290 includes an exhaust channel 294 formed within the insert plate 279 positioned within sidewall 218. A vacuum source, such as a pump (not shown) for creating low or reduced pressure in the chamber 212 is coupled to the exhaust channel 294 on the exterior of sidewall 218 by an outlet pipe 233. The process gas (or gases) fed into the upper chamber portion 222 is exhausted through the upper passage 292, through the exhaust channel 294 and into the outlet pipe 233.

The gas outlet 232 also includes a vent 296, which extends from the lower chamber portion 224 through lower liner 284 to the exhaust passage 290. The vent 296 preferably intersects the upper passage 292 through the exhaust passage 290 as shown in FIG. 4. The inert purge gas is exhausted from the lower chamber portion 224 through the vent 296, through a portion of the upper chamber passage 292, through the exhaust channel 294, and into the outlet pipe 233. The vent 296 allows for the direct exhausting of the purge gas from the lower chamber portion to the exhaust passage 290.

According to some exemplary embodiment of the present invention, the process gas or gases 298 are fed into the upper chamber portion 222 from gas inlet manifold 230. In some exemplary embodiments, the process gas is defined as the gas or gas mixture, which acts to deposit a film (e.g., an oxide film) on a wafer or a substrate that is placed in chamber 212. In one embodiment, the process gas comprises (a) an oxygen gas carried in an inert carrier gas such as helium, argon, and xenon; (b) a silicon source gas such as silane, disilane, dichlorosilane, trichlorosilane, tetrachlorosilane, and hexachlorodisilane; (c) a dilution gas such as hydrogen gas. In another example, where the silicon source gas does not include any chlorine (e.g., silane or disilane), the process gas mixture includes a hydrochloride source gas (HCl).

In one exemplary embodiment, while the process gas is fed into the upper chamber portion 222, an inert purge gas or gases 299 are fed independently into the lower chamber portion 224. Purging the chamber 212 with the inert purge gas 299 prevents an unwanted reaction at the bottom side of the chamber 212 or the bottom side of the susceptor 220.

In one exemplary embodiment, the apparatus 210 shown in FIG. 4 is a single wafer reactor that is also "cold wall" reactor. The sidewall 218 and upper and lower liners 282 and 284, respectively, are at a substantially lower temperature than the preheat ring 228 and the susceptor 220 (and a substrate placed thereon) during processing. For example, when an oxide deposition process occurs at a process temperature between 1000° C. and 1200° C. the susceptor and the wafer are heated to a temperature between 1000° C. and 1200° C. while the sidewall and the liners are at a temperature of about 400–600° C. The sidewall 218 and liners 282 and 284 are at a cooler temperature because they do not receive direct irradiation from lamps 234 due to reflectors 235, and because cooling fluid is circulated through the sidewall 218.

In another exemplary embodiment, the processing apparatus 210 shown in FIG. 4 includes a system controller 150, which controls various operations of the apparatus 210 such as controlling process gas flows into the chamber 212, controlling the substrate's temperature, controlling the susceptor 220's temperature, and controlling the chamber's pressure. In one exemplary embodiment, the system controller 150 includes a memory stored in a machine-readable medium 152 such as a hard disk drive (indicated in FIG. 4 as "memory 152") or a floppy disk drive. The system controller 150 also includes a processor 154. An input/output device 156 such as a CRT monitor and a keyboard is used to interface between a user the and the system controller 150.

The processor 154 contains a single board computer (SBC), analog and digital input/output boards, interface boards and stepper motor controller board. Various parts of the apparatus 210 conform to the Versa Modular Europeans (VME) standard which defines board, card cage, and connector dimensions and types. The VME standard also defines the bus structure having a 16-bit data bus and 24-bit address bus.

In one exemplary embodiment, the system controller 150 controls all of the activities of the apparatus 210. The system controller executes system control software, which is a computer program stored in the machine-readable medium 152. Preferably, the machine-readable medium 152 is a hard disk drive, but the machine-readable medium 152 may also be other kinds of memory stored in other kinds of machine-readable media such as one stored on another memory device including, for example, a floppy disk or another appropriate drive. In one embodiment, the computer program includes sets of instructions that dictate the timing, mixture of gases, chamber pressure, chamber temperature, lamp power levels, susceptor position, and other parameters for depositing an oxide film in accordance with the present invention.

In another embodiment, the process for depositing films (e.g., an oxide film) in accordance with the present invention can be implemented using a computer program product, which is stored in the machine-readable medium 152 and, is executed by the processor 154. The computer program code can be written in any conventional computer readable programming language, such as, 68000 assembly language, C, C++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program. Also stored in the machine-readable medium 152 are process parameters such as the process gas flow rates (e.g., the oxygen gas flow rate, the silicon source gas flow rate, and the dilution gas flow rate), the process temperatures and the process pressure necessary to carry out the deposition of the oxide film in accordance with the exemplary embodiments of the present invention.

In one embodiment, the computer program product (program) executed by the processor 154 controls the process temperature to be between 800° C. and 1300° C. and the process pressure to be between 20 Torr and 760 Torr. The program also controls the introduction of the process gas mixture into the chamber 212. The program also controls the process gas mixture to comprise (a) an oxygen gas carried in an inert carrier gas such as helium, argon, and xenon; (b) a silicon source gas such as silane, disilane, dichlorosilane, trichlorosilane, tetrachlorosilane, and hexachlorodisilane; and (c) a dilution gas such as hydrogen gas. The program also controls the process gas mixture to comprise less than 6% oxygen, a silicon gas, and predominantly hydrogen during the deposition of the oxide film. The program may control the process gas mixture to comprise a sufficient amount of the silicon gas to allow for deposition of the oxide film. In one embodiment, the process gas mixture may comprise about 110% silicon gas. In another embodiment, the process gas mixture may comprise less than 6% silicon gas.

It is to be appreciated that the oxide film deposited in accordance with the present invention can be carried out in apparatuses other than the apparatus 210 described in FIG. 4, for example, a resistively heated single wafer deposition chamber known in the art.

Figure 5A:
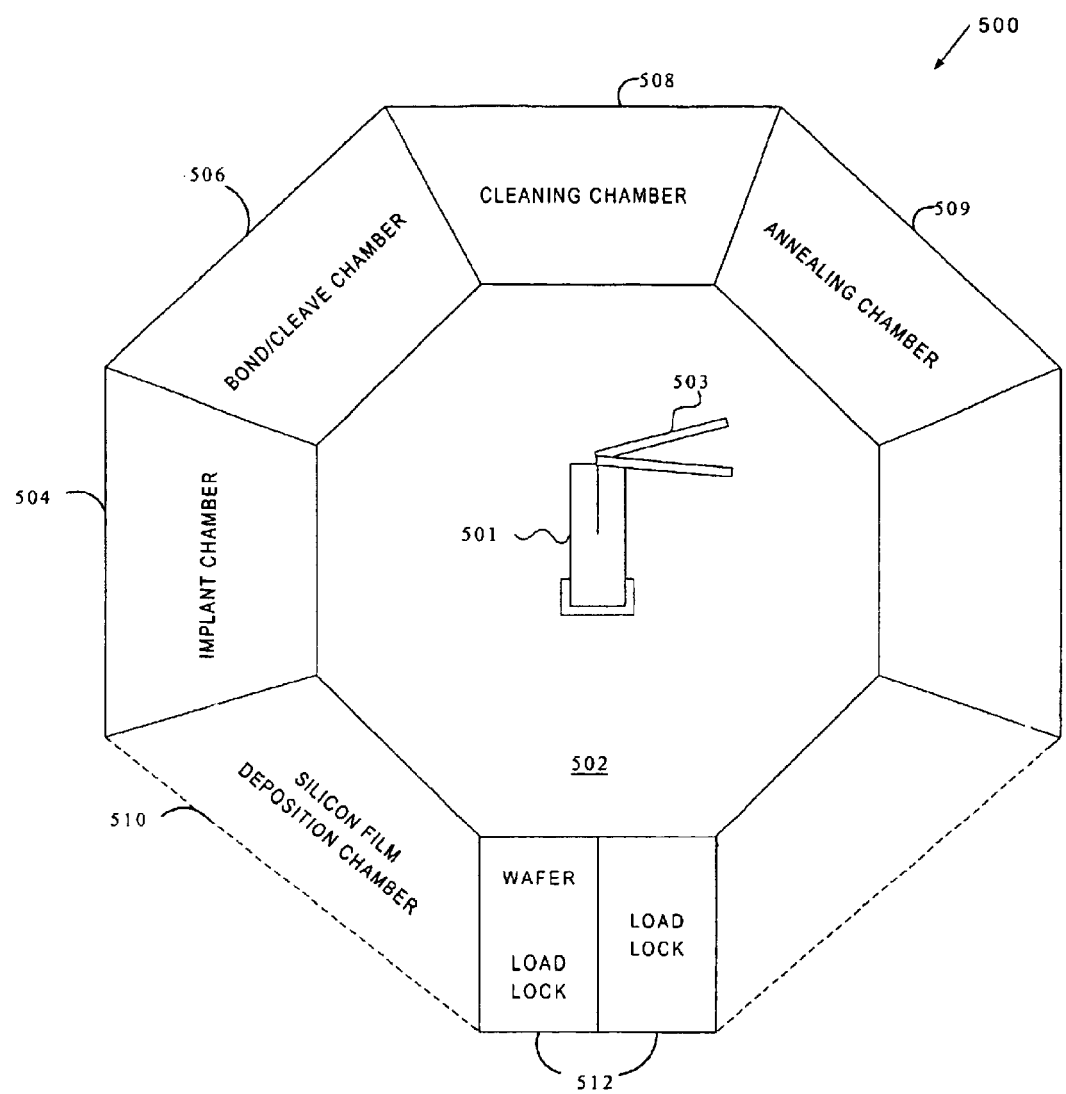
FIG. 5A illustrates an exemplary cluster tool which can be used for some exemplary embodiments of the present invention.

FIG. 5A is an example of a cluster tool 500 in which the oxide film can be formed. In one embodiment, the cluster tool 500 is used to form a film stack such as an SOI substrate. The film stack includes at least one oxide film that is formed using the method 300 described in FIG. 3.

In one exemplary embodiment, the cluster tool 500 includes a transfer chamber 502 to which are attached a plurality of different process apparatuses including, an implant chamber 504, a bond/cleave chamber 506, a silicon film deposition chamber 510, a cleaning chamber 508, an annealing chamber 509, and a loadlock apparatus 512. Other chambers, such as a cool down chamber or chambers and/or additional loadlocks, can be attached to transfer chamber 502 as required.

In general, the implant chamber 504 is used to implant ions into a donor wafer to form dislocations in a donor wafer to enable the subsequent cleaving of the silicon film. The bond/cleave chamber 506 is used to bond a handle wafer to the implanted donor wafer and is used to cleave the donor wafer from the handle wafer at the implant dislocation.

The silicon film deposition chamber 510 is used to form an oxide film on the donor wafer (or handle water if desired) using the exemplary embodiments of the present invention (e.g., the method 300). The silicon film deposition chamber 510 can be, for example, the apparatus 210 described above in FIG. 4. Alternatively, the silicon film deposition chamber 510 can be other type of chemical vapor deposition (CVD) apparatus.

The cleaning chamber 508 can be a conventional cleaning chamber that utilizes a cleaning solution such as hydrogen fluoride. The cleaning chamber can be used to remove contaminants or particles on a substrate during any step of making the film stack.

The loadlock system 512 is used to transfer wafers or substrates into a transfer chamber 502 of cluster tool 500. The transfer chamber 502 may include a wafer handling apparatus 501, which includes a wafer-handling clip 503. The wafer handling apparatus 501 and the wafer-handling clip 503 facilitate the transport of wafer substrates in an out of a particular process apparatus or chamber. The transfer chamber 502 is further attached to an exhaust system (not shown) such as a pump and a source of inert gas, such as nitrogen ($N_2$) so that wafers can be transferred between the various process apparatuses or chambers in the cluster tool 500 in a reduced pressure ambient or in an inert ambient so that substrates are not exposed to an oxidizing ambient or to sources of contamination.

Figure 5B:
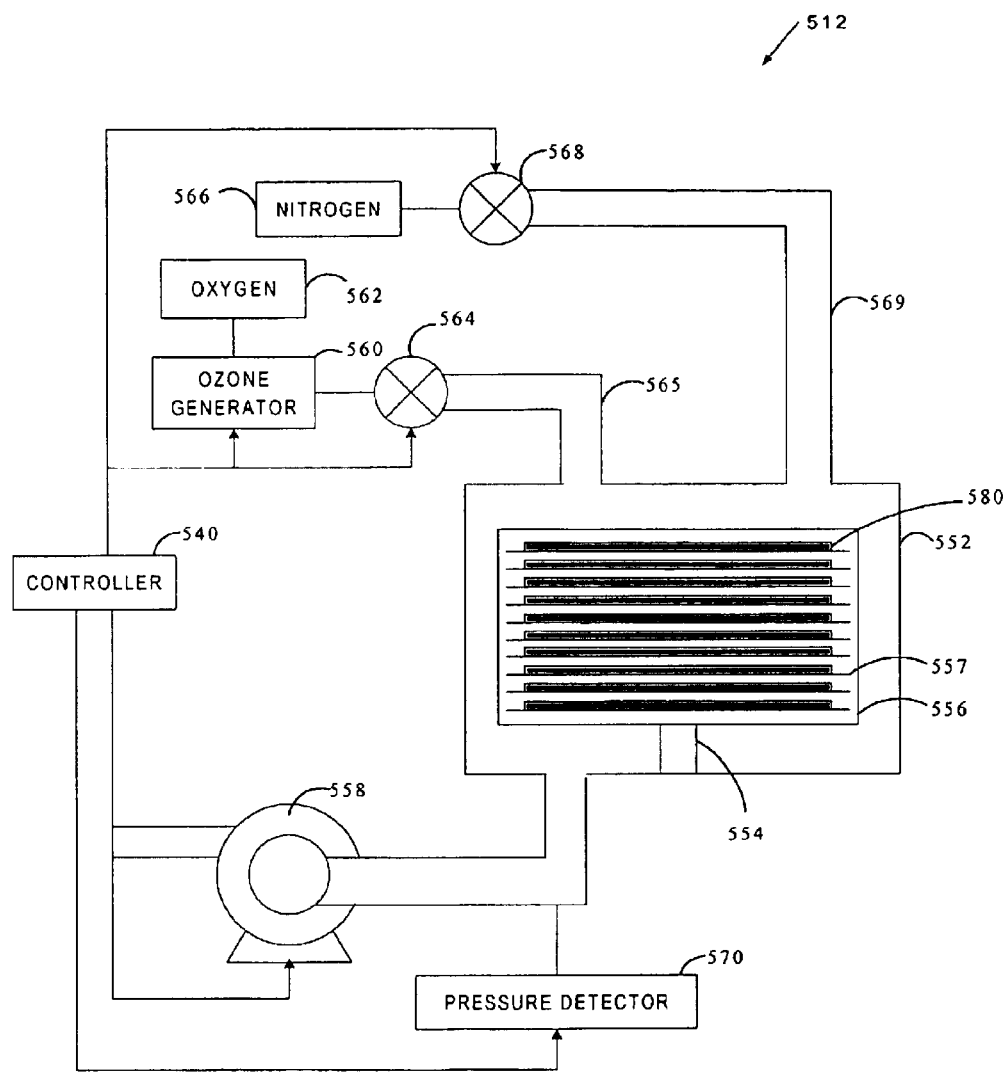
FIG. 5B illustrates an exemplary loadlock apparatus which can be utilized to form an encapsulation oxide film.

In one exemplary embodiment, the film stack that is formed in the cluster tool 500 is further protected by an encapsulation layer. In one embodiment, after the film stack is formed, the substrate with the film stack is placed in the loadlock apparatus 512. An ozone gas is introduced into the loadlock apparatus 512. The substrate is "soaked" with the ozone gas. The ozone gas forms a stable oxide layer that acts as an encapsulation layer to protect the film stack. FIG. 5B illustrates an exemplary loadlock apparatus 512 in more detail.

The loadlock apparatus 512 includes a loadlock chamber 552. The loadlock chamber 552 stores from one to a plurality of substrates (e.g., wafers) to be processed by the cluster tool 500. The loadlock chamber 552 includes a cassette elevator 554, a wafer cassette 556, and a plurality of evenly spaced apart fins 557 wherein each of the fins 557 supports a single substrate 580.

The loadlock apparatus 512 further includes an ozone generator 560, which is coupled to an oxygen source gas 562. The oxygen source gas 562 may comprise a substantially pure oxygen gas. In one embodiment, the oxygen gas has a purity of 99.999%. The ozone generator 560 generates an ozone gas from the oxygen source gas 562. The ozone gas is metered into the loadlock chamber 552 through an ozone supply valve 564 and an ozone supply line 565.

The loadlock apparatus 512 further includes a nitrogen source gas 566 which supplies nitrogen gas into the loadlock chamber 552 through a nitrogen supply valve 568 and a nitrogen supply line 569.

The loadlock apparatus 512 also includes a pump 558 which can be used to control the pressure within the loadlock chamber 552. A pressure detector 570 may also be included to monitor the pressure within the loadlock chamber 552.

Details of an example of an apparatus that can be used to soak the substrate with the ozone gas to form the encapsulation film can be found in U.S. Pat. No. 6,376,387, which is assigned to Applied Materials.

There are advantages for forming the encapsulation oxide film in the loadlock apparatus 512. One advantage is that another chamber that is designated for a step in an existing process does not have to be dedicated for exposing the substrate to the ozone gas. Another advantage is that such a system is relatively safe because there is a substantially reduced likelihood that the ozone gas will mix with hydrogen gas within the cluster tool 500 and cause an explosion because the pressure within the loadlock apparatus 512 is always below atmospheric pressure of an area around the loadlock apparatus 512 when the ozone gas is within the loadlock apparatus 512 so that there is reduced likelihood that the ozone gas will escape to a surrounding area and possibly cause an explosion. Another advantage is that the overall time taken to process wafers is maintained.

It is to be appreciated that soaking the film stack with ozone is not the only way to form the encapsulation layer. In an alternative embodiment, an encapsulation layer is a passivation layer that is formed over the film stack following the deposition of the last film of the film stack. The passivation layer can be formed on the film stack in the same deposition chamber. In one embodiment, the passivation layer is formed by flowing hydrogen into the deposition chamber. In embodiments where the hydrogen gas is already present in the chamber (as the hydrogen gas is used as a carrier gas), all of the process gases (e.g., the silicon source gas and the oxidation source gas) are shut off while the flow of the hydrogen gas is continued. Additionally, the temperature of the deposition chamber is maintained or elevated anywhere from 500° C. to 1200° C. for a brief amount of time (e.g., 1–5 seconds) when the hydrogen gas flow is continued. The hydrogen reacts with the surface silicon atoms of the film stack. Then, the deposition chamber is cooled down, hence cooling the film stack, while the flow of the hydrogen gas is continued for another brief amount of time (e.g., 1–5 seconds). At this point, the surface of the film stack is hydrogen terminated and a passivation layer is formed over the surface of the film stack. In another embodiment, the hydrogen gas is replaced with a nitrogen gas to form the passivation layer.

In yet another alternative embodiment, the silicon source gas is used to form an encapsulation layer over the film stack. The silicon source gas can be silane ($SiH_4$) or disilane ($Si_2H_6$). The encapsulation layer can be formed on the film stack in the same deposition chamber. In forming the encapsulation layer with the silicon source gas, the carrier gas (e.g., hydrogen) and the silicon source gas are continued to be flown into the deposition chamber after the deposition of the last film of the film stack. Additionally, the temperature of the deposition chamber is maintained such that the silicon source gas is partially dissociated and in an unstable state, for example, between room temperature and 500° C. The hydrogen gas and the silicon source gas flows at this temperature are continued for a brief amount of time (e.g., 10–15 seconds). The unstable silicon source gas (e.g., $SiH_3$ or $SiH_5$) reacts with the surface silicon atoms of the film stack forming a silicon encapsulation layer. Then, the deposition chamber is cooled down, hence cooling the film stack, while the flow of the hydrogen gas and the silicon source gas are continued for another brief amount of time (e.g., 1–5 seconds). At this point, the surface of the film stack is terminated with the partially dissociated silicon source gas and an encapsulation layer is formed over the surface of the film stack.

There are advantages for the encapsulation layer or the passivation layer in the same deposition chamber that is used to formed the film stack. The film stack need not be removed from the chamber and be exposed to another environment. The gas or gases that are used to form the encapsulation layer or the passivation layer can be the same gases as those used to form the film stack.

In one exemplary embodiment, the loadlock apparatus 512 is coupled to a controller 540, which is used for controlling various components (e.g., chambers 510, 509, 504, 506, and 502) of the cluster tool 500. For example, the program receives an input from the pressure detector 570 and controls all of the components based on the pressure detected by the pressure detector 570. The controller 540 is similar to the controller 150 shown in FIG. 4. The controller 540 is typically a computer having a processor (not shown) that can execute a program (a set of instructions) that controls all of the components of the cluster tool 500. The processor is similar to the processor 154 shown in FIG. 4.

In one embodiment, a computer program product is stored in a machine readable medium that is coupled to the controller 540 and is executed by the processor. In this embodiment, the program controls the oxide film deposition described above. The program also controls the making of a film stack using the cluster tool 500.

FIGS. 6A–6E and FIGS. 7–11 illustrate an exemplary flow process of making a film stack such as an SOI substrate. In one embodiment, the controller 540 mentioned above controls the process descried in these figures.

Figure 6A:
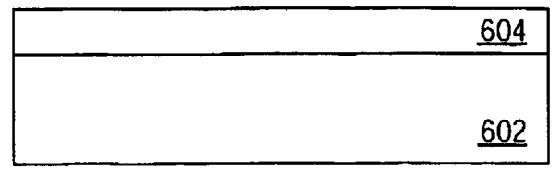
FIGS. 6A–6C illustrate an exemplary method of forming an SOI substrate in accordance with the present invention.

In FIG. 6A, a substrate 602 is provided. The substrate 602 is placed in the silicon film deposition chamber 510. The substrate 602 can be a semiconductor wafer or a silicon wafer. In one embodiment, the substrate 602 is made out of monocrystalline silicon. In one exemplary embodiment, an epitaxial silicon film 604 is formed on a surface of the substrate 602. The epitaxial silicon film 604 can be doped with boron and may have a dopant concentration of about $1\times10^{15}$ to $1\times10^{19}$ atoms/cm³. Having the epitaxial silicon film 604 is useful because the epitaxial silicon film 604 has better controlled properties than the monocrystalline silicon for purposes of forming semiconductor devices therein and thereon. In one embodiment, the substrate 602 does not have the epitaxial silicon film 604 deposited thereon.

In one embodiment, to deposit the epitaxial silicon film 604, the silicon film deposition chamber 510 is brought to a temperature between 600° C. to 1300° C. A process gas mixture comprising a hydrogen gas and a silicon source gas (e.g., silane, disilane, etc.) is introduced into the chamber 510. Optionally, the process gas mixture may comprise a boron source gas such as diborane ($B_2H_6$). The boron source gas is included so that the epitaxial silicon film 604 that is deposited is also doped with boron. In one embodiment, the epitaxial silicon film 604 has dopant concentration of about $1\times10^{15}$ to $1\times10^{19}$ atoms/cm³. Once the epitaxial silicon film 604 is formed, the substrate 602 is removed from the chamber 510.

Figure 6B:
Figure 6B:
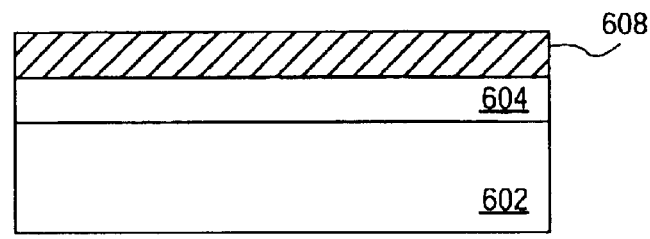

In one exemplary embodiment, the substrate 602 is a donor wafer. The donor wafer is the wafer that provides a layer or layers to be transferred. In this embodiment, an oxide film 608 is deposited the epitaxial silicon film 604 as illustrated in FIG. 6B. In one embodiment, the substrate 602 is placed into the silicon film deposition chamber 510. Using the method 300 described above, the oxide film 608 is deposited at a pressure between 20 Torr and 760 Torr and at a temperature between 800° C. and 1300° C., ideally, between 1000° C. and 1200° C. The process gas mixture used to deposit the oxide film 608 comprises (a) an oxygen gas carried in an inert carrier gas such as helium, argon, and xenon; (b) a silicon source gas such as silane, disilane, dichlorosilane, trichlorosilane, tetrachlorosilane, and hexachlorodisilane; and (c) a dilution gas such as hydrogen gas. In one embodiment, where the silicon source gas does not include any chlorine, the process gas mixture includes a hydrochloride source gas (HCl). For example, when the silane or disilane gas is used, the process gas mixture includes an HCl gas. Additionally, at all time during the deposition, the process gas mixtures comprise less than 6% oxygen, a silicon gas, and predominantly hydrogen. In another embodiment, the process gas mixture may comprise a sufficient amount of the silicon gas to allow for deposition of the oxide film. In one embodiment, the process gas mixture may comprise about 1–10% silicon gas. In another embodiment, the process gas mixture may comprise less than 6% silicon gas.

In one embodiment, the oxide film 608 is deposited to a thickness between 400 Å to 1500 Å. In another embodiment, 1–5 minutes are required to form the oxide film 608 with a thickness between 400 Å to 1500 Å.

Figure 6C:
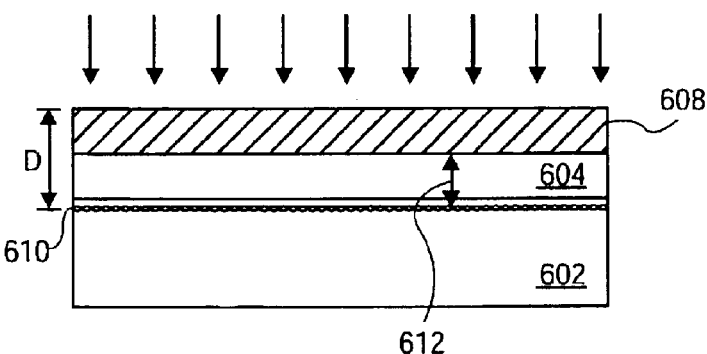

Next, as shown is FIG. 6C, the substrate 602 is implanted with ions to form dislocation 610. To implant the ions, the substrate 602 is moved into the implant chamber 504. In one embodiment, the substrate 602 is implanted with hydrogen atoms or with inert ions such Argon (Ar) or Helium (He). In another example, the substrate 602 is ion implanted with a plasma immersion ion implantation process. Such a process can implant high doses of hydrogen atoms into the substrate 602. In such a process, a high voltage negative bias is applied to the substrate 602 to accelerate the ions towards the wafer face (the oxide film 608). The plasma immersion ion implantation process implants the entire surface of the substrate 602. In another exemplary embodiment, the P-III Ion Implantation System developed by Silicon Genesis can be used for a plasma immersion ion implantation step. Further yet, the ion implantation can be carried out using, for example, beam line ion implantation equipment manufactured from companies such as Applied Materials, Axcelis Corp., Varian, and others.

In one exemplary embodiment, the implantation of the hydrogen atoms generates an internal hydrogen rich layer, which is the dislocation 610 within the substrate 602. A predetermined depth, D, of the ion implantation peak determines the amount of silicon 612 which will subsequently be removed from the substrate 602. In one exemplary embodiment, the hydrogen ions are implanted slightly below the epitaxial silicon layer 604. In another exemplary embodiment, the hydrogen ions are implanted at the bottom of the epitaxial silicon layer 604. In yet another embodiment, the hydrogen ions are implanted between 100–500 nm into the substrate 602.

In some events, before the deposition of the oxide film 608, the substrate 602 with the epitaxial silicon film 604 may have been formed by a different process and may have to be stored until the process for forming the oxide film 608 takes place. In these events, the epitaxial silicon film 604 is protected by an encapsulation oxide film (not shown) that is formed on the epitaxial silicon film 604. In one embodiment, the substrate 602 is placed in the loadlock apparatus 512. Communication between the loadlock apparatus 512 and other chambers such as the silicon film deposition chamber 510 attached to the cluster tool 500 is shut off. The oxygen source gas 562 is introduced into the ozone generator 560. The ozone generator 560 generates an ozone gas. The ozone gas is then supplied into the loadlock chamber 552 through the ozone supply valve 564 and the ozone supply line 565. Once the loadlock chamber 552 is soaked with the ozone gas, the ozone supply valve 564 is shut off. The epitaxial silicon film 604 is exposed to the ozone gas for a predetermined amount of time, for example, from one to fifteen minutes to form the encapsulation film.

In one embodiment, after the encapsulation film 606 is formed, the ozone gas is pumped out of the loadlock chamber 512 using the pump 558. Then, the nitrogen gas source 566 is supplied into the loadlock chamber 512 to purge the loadlock chamber 512.

Alternatively, the epitaxial silicon film 604 is protected by an encapsulation film that is formed by a hydrogen termination process. In this case, when the substrate 602 is still in the deposition chamber 510 after the epitaxial silicon film 604 is formed, the encapsulation film is formed on top of the epitaxial silicon film 604. In one embodiment, the hydrogen gas that is the carrier gas that is used to form the epitaxial silicon film 604 is continued to be flown into the deposition chamber 510 while the silicon source gas is shut off. The temperature of the deposition chamber 510 is maintained or elevated anywhere from 600° C. to 1200° C. for a brief amount of time (e.g., 10–15 seconds) when the hydrogen gas flow is continued. The hydrogen reacts with the surface silicon atoms of the epitaxial silicon film 604. Then, the deposition chamber 510 is cooled down while the flow of the hydrogen gas is continued for another brief amount of time (e.g., 1–5 seconds). The encapsulation film is then formed on top of the epitaxial silicon film 604. The substrate 602 with the epitaxial silicon film 604 can now be removed from the deposition chamber 510 without worrying about contamination to the epitaxial silicon film 604.

Alternatively, the encapsulation film can also be formed using the hydrogen termination process similar to described above with the presence the silicon source gas, e.g., silane ($SiH_4$) or disilane ($Si_2H_6$). The encapsulation layer can be formed on the epitaxial silicon film 604 in the same deposition chamber 510. In forming the encapsulation layer with the silicon source gas, the hydrogen gas and the silicon source gas are continued to be flown into the deposition chamber after the deposition of the epitaxial silicon film 604. The temperature of the deposition chamber 510 is maintained such that the silicon source gas is partially dissociated and in an unstable state, for example, between room temperature and 500° C. The hydrogen gas and the silicon source gas flows at this temperature are continued for a brief amount of time (e.g., 1–5 seconds). The unstable silicon source gas (e.g., $SiH_3$ or $SiH_5$) reacts with the surface silicon atoms of the epitaxial silicon film 604 forming the encapsulation layer. Then, the deposition chamber 510 is cooled down while the flow of the hydrogen gas and the silicon source gas are continued for another brief amount of time (e.g., 1–5 seconds). The encapsulation film is then formed on top of the epitaxial silicon film 604. The substrate 602 with the epitaxial silicon film 604 can now be removed from the deposition chamber 510 without worrying about contamination to the epitaxial silicon film 604.

In one embodiment, the encapsulation film has a thickness between 10 Å and 15 Å. The encapsulation film is extremely pure because of the controlled conditions and the purity of the ozone gas, the oxygen gas, the hydrogen gas, or the silicon source gas, that the substrate 602 is exposed to. The encapsulation film protects the epitaxial silicon film 604 from impurities and contaminants. After the encapsulation film is formed, the substrate 602 can be exposed to air without worry about contaminations to the epitaxial silicon film 604. The encapsulation film can be removed using conventional methods such as a hydrogen fluoride cleaning method before deposition of other films onto the epitaxial silicon film 604. For example, before deposition of another film on the epitaxial silicon film 604, the encapsulation film is removed by placing the substrate 602 in the cleaning chamber 508. Hydrogen fluoride is introduced into the cleaning chamber to remove the encapsulation film.

The encapsulation film formed under a controlled environment such as those previously described is useful when the epitaxial silicon film 604 needs to be extremely thin. If a native oxide or other surface layer is grown on the epitaxial silicon film 604, the native oxide or the other surface layer is not very uniformed and not well controlled. Removing this "non-uniform" and "not-well-controlled" layer may impact the thickness uniformity of the extremely thin epitaxial silicon film 604. When the encapsulation film is formed under the controlled environments, the encapsulation film is uniform. Removing such uniform encapsulation film will not consume much (if any) of the extremely thin epitaxial silicon film 604. Thus, the uniformity of the epitaxial silicon film 604 is maintained.

Figure 7:
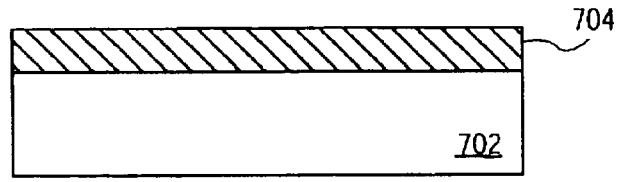
FIG. 7 illustrates another exemplary method forming an SOI substrate in accordance with the present invention.

In one exemplary embodiment, another substrate, substrate 702, similar to the substrate 602 is provided as illustrated in FIG. 7. The substrate 702 is a handle wafer that receives the transferred layers from the donor wafer (the substrate 602). The substrate 702 will eventually become the substrate for the SOI substrate. In one embodiment, the substrate 702 is a monocrystalline silicon. The substrate 702 can be doped to any conductivity type (n-type or p-type) and to any conductivity level desired. In one exemplary embodiment, the substrate 702 is a p-type substrate having a doping density of between $10^{15}$–$10^{19}$ atoms/$cm^3$.

In one exemplary embodiment, the substrate 702 also includes an oxide film 704 formed thereon. In one exemplary embodiment, the oxide film 704 is between 400 Å to 1500 Å thick. The oxide film 704 can be deposited by using the same method used to deposit the oxide film 608 shown in FIG. 6B.

In one exemplary embodiment, only one of the substrate 602 or the substrate 702 has the oxide film grown thereon. Thus, only the oxide film 608 is grown on the substrate 602 or only the oxide film 704 is grown on the substrate 702.

Figure 8:
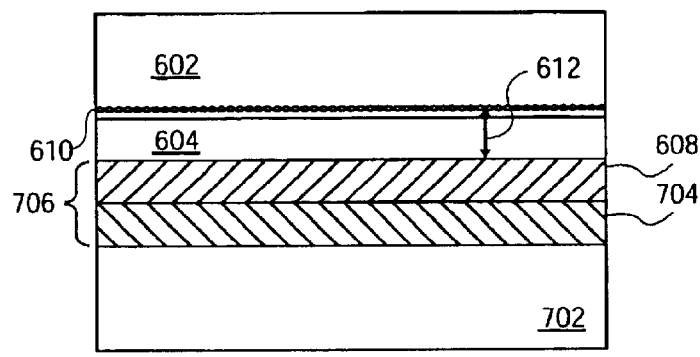
FIGS. 8, 9, 10, and 11 illustrate yet another exemplary method of forming an SOI substrate in accordance with the present invention.

Next, the ion implanted substrate 602 and the substrate 702 are bonded together as illustrated in FIG. 8. In one embodiment, the ion implanted substrate 602 and the substrate 702 are placed into the bond/cleave chamber 506. In the bond/cleave chamber 506, the substrate 602 is bonded to the substrate 702 in that the oxide film 608 of the substrate 602 is bonded to the oxide film 704 of the substrate 702 forming an oxide film 706. In an embodiment where only one of the substrate 602 or the substrate 702 has the oxide film grown thereon, the oxide film is sandwiched between the substrate 602 and the substrate 702 when the substrate 602 is bonded to the substrate 702.

In one exemplary embodiment, the substrate 702 and the substrate 602 are bonded using a low temperature plasma activated bond process. By using plasma activation of the bond interface, higher bond strength can be achieved at low process temperatures (e.g. room temperature). In this embodiment, both the substrate 702 and the substrate 602 are exposed to a low temperature plasma in order to generate plasma activated bonding surfaces' It is to be appreciated that other suitable bonding techniques may be used to bond the handle wafer to the donor wafer.

In one exemplary embodiment, the substrate 702 and the substrate 602 are compressed together to securely bond the two interfaces of the substrates together. The plasma activation of the bond interface helps achieve a sufficiently strong bonding for a subsequent room temperature cleave process.

Figure 9:
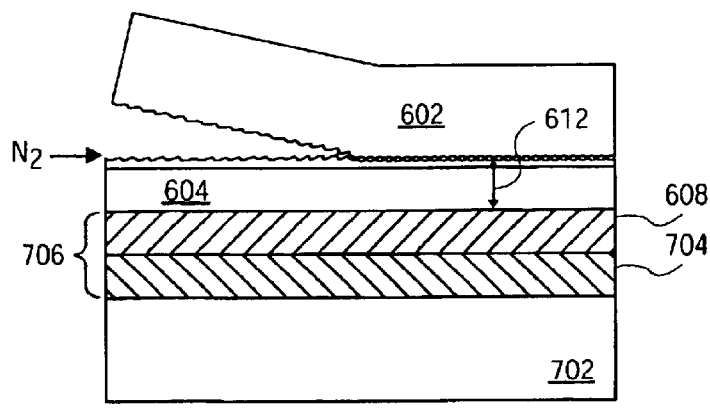

Next, as shown in FIG. 9, the portion 659 of substrate 602 is separated or cleaved from the portion 612 of the substrate 602 at the dislocation 610. In one exemplary embodiment, a Room Temperature Controlled Cleaved Process (RT/CCP) is used to separate the bonded pair at the implant dislocation 656 without using heat. The RT/CCP process initiates a separation at one point on the wafer and propagates that separation cross the entire wafer through a mechanical cleaving method. In another exemplary embodiment and as shown in FIG. 6E, a nitrogen ($N_2$) stream is focused at the edge of the dislocation to cause the separation.

After the bond and cleave process, an SOI substrate is generated. The SOI substrate comprises the silicon substrate 702, the oxide layer 706 buried under a layer of silicon 612. In one embodiment, the layer of silicon 612 comprises only the epitaxial silicon film 604. In another embodiment, the layer of silicon 612 comprises the epitaxial silicon layer 604 and a portion of the monocrystalline silicon transferred from the substrate 602. In an embodiment where the substrate 602 does not have the epitaxial silicon film 604 deposited thereon, the layer of silicon 612 only comprises of the portion of the monocrystalline silicon transferred from the substrate 602.

Figure 10:
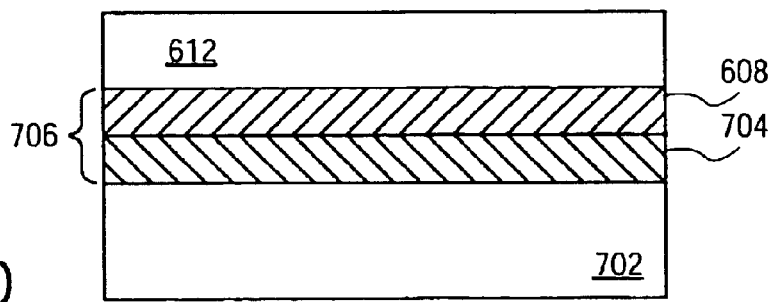

In one exemplary embodiment, the layer of silicon 612 has a rough surface due to the cleaving process. The layer of silicon 612 is further treated to thin and smooth the surface of the layer of silicon 612 as shown in FIG. 10. Exemplary methods of treating the silicon layer 612 include a hydrogen annealing process, a hydrochloric acid etching process that includes a hydrogen gas, and gas cluster ion beam etching process. Additionally, the hydrochloric acid etching process that includes a hydrogen gas may also include a silicon source gas (e.g., silane or disilane, etc.) to further smooth the surface of the silicon layer 612. In one embodiment, the substrate 702 is placed in the annealing chamber 509 for treating the surface of the silicon layer 612. In another embodiment, the substrate 702 is placed in the silicon film deposition chamber 510 for treating the surface of the silicon layer 612 with hydrochloric acid etching process. In one embodiment, after the silicon layer 612 is treated, the silicon layer 612 only comprises of the epitaxial silicon layer 604 and any portion of the substrate 602 that got transferred to the substrate 702 can be removed during the treating process.

Figure 11:
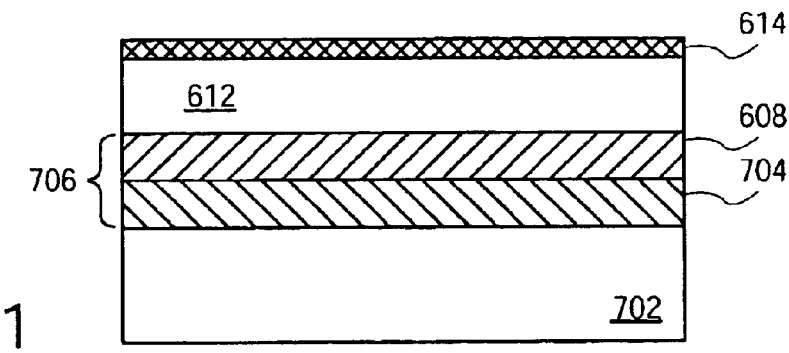

In one exemplary embodiment, an encapsulation oxide layer 614 is formed over the silicon layer 612 as illustrated in FIG. 11. In one embodiment, the substrate 702 is placed in the loadlock apparatus 512. Communication between the loadlock apparatus 512 and other chambers such as the silicon deposition chamber 510 attached to the cluster tool 500 is shut off. The oxygen source gas 562 introduced an oxygen gas into the ozone generator 560. The ozone generator 560 generates an ozone gas. The ozone gas is then supplied into the loadlock chamber 552 through the ozone supply valve 564 and the ozone supply line 565. Once the loadlock chamber 552 is soaked with the ozone gas, the ozone supply valve 564 is shut off. The silicon layer 612 is then exposed to the ozone gas for a predetermined amount of time, for example, from one to fifteen minutes to form the encapsulation film 614.

In another embodiment, an encapsulation layer 604 is formed over the silicon layer 612 using a hydrogen termination process. The substrate 702 is placed in the film deposition chamber 510. Hydrogen gas is flown into the deposition chamber 510 while other process gases are shut off. The temperature of the deposition chamber 510 is maintained or elevated anywhere from 600° C. to 1200° C. for a brief amount of time (e.g., 1–5 seconds). Then, the deposition chamber 510 is cooled down while the flow of the hydrogen gas is continued for another brief amount of time (e.g., 1–5 seconds).

The hydrogen termination process used above to form the encapsulation layer 604 may include a silicon source gas e.g., silane ($SiH_4$) or disilane ($Si_2H_6$). In forming the encapsulation layer 604 with the silicon source gas, the hydrogen gas and the silicon source gas are flown into the deposition chamber 510. The temperature of the deposition chamber 510 is maintained such that the silicon source gas is partially dissociated and in an unstable state, for example, between room temperature and 500° C. The hydrogen gas and the silicon source gas flows at this temperature are continued for a brief amount of time (e.g., 10–15 seconds). Then, the deposition chamber 510 is cooled down while the flow of the hydrogen gas and the silicon source gas are continued for another brief amount of time (e.g., 1–5 seconds).

The encapsulation film formed under a controlled environment such as those previously described is useful when the silicon film 612 needs to be extremely thin. When the encapsulation film 604 is formed under the controlled environments, the encapsulation film 604 is uniform. Removing such uniform encapsulation film 604 will not consume much (if any) of the extremely thin silicon film 612. Thus, the uniformity of the epitaxial silicon film 604 is maintained.

The SOI substrate shown in FIG. 11 is now ready for semiconductor devices to be formed therein and thereon.

Although the exemplary embodiments above focus on forming a film stack on one substrate, the exemplary embodiments can be applied for forming multiple film stacks on multiple substrates in the cluster tool 500. For example, while an oxide film is deposited on a first substrate in the silicon film deposition chamber 510, a second substrate can be placed in other chambers for other processing.

Methods and apparatuses for forming a high quality oxide film have been described. Methods and apparatuses for incorporating the oxide film into forming a film stack such as an SOI substrate have also been described.

What is claimed is:

1. A method of forming an oxide film comprising:
   providing a first substrate;
   depositing an oxide film on said first substrate using a process gas mixture that comprises a silicon source gas, an oxygen gas, and a hydrogen gas, and a process temperature between 800° C. and 1300° C. wherein during said depositing, said process gas mixture comprises less than 6% oxygen, a silicon gas, and predominantly hydrogen.

2. The method of claim 1 wherein said process gas mixture comprises a sufficient amount of said silicon gas for depositing said oxide film.

3. The method of claim 1 wherein said depositing further uses a process pressure between 20 Torr and 760 Torr.

4. The method of claim 1 wherein said silicon source gas is selected from a group consisting of silane, disilane, dichlorosilane, trichlorosilane, tetrachlorosilane, and hexachlorodisilane.

5. The method of claim 1 wherein said process gas mixture further comprises a hydrochloride source gas.

6. The method of claim 5 wherein when said silicon source gas is one of a silane gas and a disilane gas, said process gas mixture comprises a hydrochloride (HCl) gas.

7. The method of claim 1 wherein said depositing occurs in a single wafer deposition chamber.

8. The method of claim 7 wherein said single wafer deposition chamber is further coupled to a cluster tool, said cluster tool including at least one loadlock apparatus to store said substrate.

9. The method of claim 8 further comprising:
depositing a silicon film on top of said oxide film to form a film stack.

10. The method of claim 9 further comprising:
depositing an encapsulation film on said silicon film of said film stack to protect said silicon film using a hydrogen termination process.

11. The method of claim 9 further comprising:
depositing an encapsulation film on said silicon film of said film stack to protect said silicon film using a hydrogen termination process wherein only said hydrogen gas and said silicon source gas that includes one of silane and disilane are used.

12. The method of claim 9 further comprising:
depositing an encapsulation film on said silicon film of said film stack to protect said silicon film in said loadlock apparatus and by introducing an ozone gas into a loadlock chamber wherein communication between said loadlock apparatus and said single wafer deposition chamber is shut off.

13. The method of claim 1 wherein said substrate is a monocrystalline silicon.

14. The method of claim 1 wherein said oxygen gas is diluted with an inert gas before being mixed with said silicon source gas and hydrogen source gas to form said process gas mixture.

15. The method of claim 14 wherein said oxygen gas is diluted with helium and wherein said oxygen gas in helium has a concentration of less than 25%.

16. A method of forming an oxide film comprising:
providing a first substrate;
depositing an oxide film on said first substrate using a process gas mixture that comprises a silicon source gas, an oxygen gas, and a hydrogen gas, and a process temperature between 800° C. and 1300° C. wherein during said depositing, said process gas mixture comprises less than 6% oxygen, a silicon gas, and predominantly hydrogen;
wherein said silicon gas in said process gas mixture ranges from 1–10%.

17. A method of forming an oxide film comprising:
providing a first substrate;
depositing an oxide film on said first substrate using a process gas mixture that comprises a silicon source gas, an oxygen gas, and a hydrogen gas, and a process temperature between 800° C. and 1300° C. wherein during said depositing, said process gas mixture comprises less than 6% oxygen, a silicon gas, and predominantly hydrogen;
wherein said silicon gas in said process gas mixture is less than 6%.

18. A substrate processing system comprising:
a single wafer deposition chamber having a susceptor to hold a substrate during a deposition process;
a controller for controlling said single wafer deposition chamber;
a machine-readable medium coupling to said controller, said machine-readable medium has a memory that stores a set of instructions that controls operations of said deposition process; and
wherein said set of instructions further controls deposition of an oxide film on a surface of said substrate using a process temperature between 800° C. and 1300° C., a process pressure between 20 Torr and 760 Torr, and a process gas mixture comprising a silicon source gas, an oxygen gas, and a hydrogen gas and wherein set of instructions further controls said process gas mixture to comprise less than 6% oxygen, a silicon gas, and predominantly hydrogen during said deposition process.

19. The substrate processing system claim 18 further comprising:
a loadlock apparatus to store said substrate before placing said substrate in said single wafer deposition chamber for said deposition process and to store said substrate after said deposition process wherein said set of instructions controls operation of said loadlock apparatus.

20. The substrate processing system claim 19 wherein said set of instructions further controls deposition of a silicon film on top of said oxide film to form a film stack.

21. The substrate processing system claim 19 wherein said set of instructions further controls placing said substrate in said loadlock apparatus and introducing an ozone gas into a loadlock chamber to deposit an encapsulation film on said silicon film.

22. The substrate processing system claim 18 wherein said set of instructions further controls said process gas mixture to comprise a sufficient amount of said silicon gas for depositing said oxide film.

23. The method of claim 18 wherein said set of instructions further controls depositing an encapsulation film on said silicon film of said film stack to protect said silicon film using a hydrogen termination process.

24. The method of claim 18 wherein said set of instructions further controls depositing an encapsulation film on said silicon film of said film stack to protect said silicon film using a hydrogen termination process wherein only said hydrogen gas and said silicon source gas that includes one of silane and disilane are used.

25. A substrate processing system comprising:
a single wafer deposition chamber having a susceptor to hold a substrate during a deposition process;
a controller for controlling said single wafer deposition chamber;
a machine-readable medium coupling to said controller, said machine-readable medium has a memory that stores a set of instructions that controls operations of said deposition process; and
wherein said set of instructions further controls deposition of an oxide film on a surface of said substrate using a process temperature between 800° C. and 1300° C., a process pressure between 20 Torr and 760 Torr, and a process gas mixture comprising a silicon source gas, an oxygen gas, and a hydrogen gas and wherein set of instructions further controls said process gas mixture to comprise less than 6% oxygen, a silicon gas, and predominantly hydrogen during said deposition process;

wherein said set of instructions further controls said silicon gas in said process gas mixture to range from 1–10%.

26. A substrate processing system comprising:

a single wafer deposition chamber having a susceptor to hold a substrate during a deposition process;

a controller for controlling said single wafer deposition chamber;

a machine-readable medium coupling to said controller, said machine-readable medium has a memory that stores a set of instructions that controls operations of said deposition process; and wherein said set of instructions further controls deposition of an oxide film on a surface of said substrate using a process temperature between 800° C. and 1300° C., a process pressure between 20 Torr and 760 Torr, and a process gas mixture comprising a silicon source gas, an oxygen gas, and a hydrogen gas and wherein set of instructions further controls said process gas mixture to comprise less than 6% oxygen, a silicon gas, and predominantly hydrogen during said deposition process;

wherein said set of instructions further controls said silicon gas in said process gas mixture to be less than 6%.

27. A method of forming a film stack comprising:

providing a first substrate;

depositing a first oxide film on said first substrate using a process gas mixture that comprises a silicon source gas, an oxygen gas, and a hydrogen gas, and a process temperature between 800° C. and 1300° C. wherein during said depositing, said process gas mixture comprises less than 6% oxygen, a silicon gas, and predominantly hydrogen;

forming a dislocation into said first substrate at a predetermined depth that determines an amount from said first substrate to be removed;

providing a second substrate;

bonding said first substrate to said second substrate wherein said first oxide film is sandwiched between said first substrate and said second substrate;

cleaving said first substrate from said second substrate at said dislocation to form a film stack comprising of said second substrate, said first oxide film, and said amount from said first substrate.

28. The method of claim 27 wherein film stack is formed in a cluster tool that includes a single wafer deposition chamber for depositing said oxide film, an implant chamber for forming said dislocation, a bond/cleave chamber to bond said first substrate to said second substrate and to cleave said first substrate from said second substrate at said dislocation.

29. The method of claim 28 wherein said cluster tool further includes at least one loadlock apparatus to store said first substrate and said second substrate.

30. The method of claim 29 further comprising:

depositing an encapsulation film on said film stack by introducing an ozone gas into a loadlock chamber, said encapsulation film to protect said film stack.

31. The method of claim 27 wherein depositing said first oxide film occurs at a process pressure between 20 Torr and 760 Torr.

32. The method of claim 27 further comprises implanting atoms from an inert gas selecting from a group consisting of hydrogen, argon, and helium into said first substrate to form said dislocation.

33. The method of claim 27 further comprises depositing second oxide film on said second substrate prior to said bonding of said first substrate to said second substrate wherein said bonding of said first substrate to said second substrate bonds said first oxide film to said second oxide film.

34. The method of claim 33 wherein said depositing said second oxide film is done by using said process gas mixture, said process temperature, and wherein said process gas mixture comprises less than 6% oxygen, a silicon gas, and predominantly hydrogen during said depositing of said second oxide film.

35. The method of claim 34 wherein said process gas mixture comprises a sufficient amount of said silicon gas for depositing said second oxide film.

36. The method of claim 34 wherein said silicon gas in said process gas mixture ranges from 1–10%.

37. The method of claim 34 wherein said silicon gas in said process gas mixture is less than 6%.

38. The method of claim 27 wherein said first substrate and said second substrate are made out of monocrystalline silicon.

39. The method of claim 27 wherein said film stack is a silicon on insulator (SOI) substrate.

40. The method of claim 27 further comprises forming an epitaxial silicon film on said first substrate prior to depositing said first oxide film wherein said film stack comprising of said second substrate, said first oxide film, and said epitaxial silicon film.

41. The method of claim 27 wherein said process gas mixture comprises a sufficient amount of said silicon gas for depositing said first oxide film.

42. The method of claim 27 wherein said silicon gas in said process gas mixture ranges from 1–10%.

43. The method of claim 27 wherein said silicon gas in said process gas mixture is less than 6%.

44. The method of claim 27 further comprises depositing an encapsulation film on said silicon film of said film stack to protect said silicon film using a hydrogen termination process.

45. The method of claim 27 further comprises depositing an encapsulation film on said silicon film of said film stack to protect said silicon film using a hydrogen termination process wherein only said hydrogen gas and said silicon source gas that includes one of silane and disilane are used.

46. A substrate processing system comprising:

a single wafer deposition chamber having a susceptor to hold a first substrate during a deposition process;

a controller for controlling said single wafer deposition chamber;

a machine-readable medium coupling to said controller, said machine-readable medium has a memory that stores a set of instructions that controls operations of said deposition process; and wherein said set of instructions further
controls a first deposition of a first oxide film on said first substrate using a process gas mixture that comprises a silicon source gas, an oxygen gas, and a hydrogen gas, and a process temperature between 800° C. and 1300° C. wherein during said depositing, said process gas mixture comprises less than 6% oxygen, a silicon gas, and predominantly hydrogen, controls a dislocation formation into said first substrate at a predetermined depth that determines an amount from said first substrate to be removed, controls a bonding of said first substrate to a second substrate wherein said first oxide film is sandwiched between said first substrate and said second substrate, and controls a cleaving of said first substrate from said second substrate at said dislocation to form a film stack comprising of said second substrate, said first oxide film, and said amount from said first substrate.

47. The substrate processing system of claim 46 further comprises an implant chamber for forming said dislocation and a bond/cleave chamber to bond said first substrate to said second substrate and to cleave said first substrate from said second substrate at said dislocation.

48. The substrate processing system of claim 47 further comprises at least one loadlock apparatus to store said first substrate and said second substrate.

49. The substrate processing system of claim 48 wherein said set of instructions further controls a second deposition of an encapsulation film on said film stack and an introduction of an ozone gas into said loadlock apparatus for form said encapsulation film.

50. The substrate processing system of claim 46 wherein said set of instructions further controls said process gas mixture to comprise a sufficient amount of said silicon gas for depositing said oxide film.

51. The substrate processing system of claim 46 wherein said set of instructions further controls said silicon gas in said process gas mixture to range from 1–10%.

52. The substrate processing system of claim 46 wherein said set of instructions further controls said silicon gas in said process gas mixture to be less than 6%.

53. The substrate processing system of claim 46 wherein said set of instructions further controls further controls depositing an encapsulation film on said silicon film of said film stack to protect said silicon film using a hydrogen termination process.

54. The substrate processing system of claim 46 wherein said set of instructions further controls further controls depositing an encapsulation film on said silicon film of said film stack to protect said silicon film using a hydrogen termination process wherein only said hydrogen gas and said silicon source gas that includes one of silane and disilane are used.

* * * * *